(12) United States Patent
Morrison et al.

(10) Patent No.: US 6,762,498 B1
(45) Date of Patent: Jul. 13, 2004

(54) BALL GRID ARRAY PACKAGE FOR HIGH SPEED DEVICES

(75) Inventors: Gary P. Morrison, Garland, TX (US); Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/611,697

(22) Filed: Jul. 1, 2003

Related U.S. Application Data (60) Provisional application No. 60/478,457, filed on Jun. 13, 2003.

(51) Int. Cl.[7] .............................................. H01L 23/52
(52) U.S. Cl. .................... 257/758; 257/759; 438/622; 438/623
(58) Field of Search ................................. 257/758, 759, 257/760; 438/118, 622, 623, 624

*Primary Examiner*—Roy Potter
(74) *Attorney, Agent, or Firm*—Frederick J. Telecky, Jr.; W. James Brady, III (57) ABSTRACT

A substrate (300) for use in semiconductor devices, having first (301*a*) and second (301*b*) surfaces and a base structure including insulating material. A plurality of I/O terminal pads (302, 303) is distributed on the first and second surfaces, respectively, and these terminal pads are interconnected by conducting traces integral to the base structure. A plurality of selected metal layers (304 to 309) is distributed in the structure; the metal layers are substantially parallel to the surfaces and separated by the insulating material from each other and from the surfaces. At least one metal layer (304 or 307, respectively) opposite each of the surfaces has openings (320*a*, 320*b*) therein configured so that the metal areas (307*a*) directly opposite each of the terminal pads (303) are electrically isolated from the remainder of the layer. The width of these openings is selected to provide a pre-determined capacitance between each of the terminals (303) and the remainder of the metal layer (307).

21 Claims, 5 Drawing Sheets

BALL GRID ARRAY PACKAGE FOR HIGH SPEED DEVICES

This application claims priority under 35 USC §119 (e)(1) of provisional application number 60/478,457, filed Jun. 13, 2003.

FIELD OF THE INVENTION

The present invention is related in general to the field of electronic systems and semiconductor devices and more specifically to the field of high speed integrated circuits in ball grid array packages.

DESCRIPTION OF THE RELATED ART

Ball Grid Array (BGA) packages have emerged as an excellent packaging solution for integrated circuit (IC) chips with high input/output (I/O) count. A BGA device generally includes an IC chip mounted on a substrate (frequently via a heat spreader) and usually encapsulated. Typical BGA packages use sheet-like substrates with I/O terminals on both surfaces and solder balls for surface mount connection to the external parts (such as printed circuit boards, PCB). In most devices, the substrates are composites of metal layers alternating with insulating layers, for instance, copper-laminated resin substrates.

In typical BGAs, one of the substrate layers includes a signal plane that provides various signal traces, which can be coupled on one end to a corresponding chip bond pad using wire bond or reflow connections. On the other end, the signal lines are coupled by solder connections to external parts and circuitry. Additionally, a ground plane will generally be included on one of the substrate layers to serve as an electrically active ground plane for improving overall device performance: lowering the inductance, providing controlled impedance, and reducing cross talk. These features become the more important the higher the BGA pin count is.

When a BGA package is used for high speed signals, the electrical performance requirements drive the need to use multi-layer substrates. As an example, for high speed digital signal processors (DSP) and mixed signal products (MSP), the package consists of four or more layers for routing. Typically, two of these routing layers are power and ground planes, which may be positioned next to the surfaces of the substrate. For high speed applications, the distance between signal and power or ground layers may only be 30 to 50 $\mu$m.

As clock frequencies and current levels increase in semiconductor devices, prevailing solutions of BGA packages are lagging in the ability to provide acceptable signal transmission, maintain signal integrity, and provide stable power and ground supplies. As a typical example, when the I/O terminal pitch is required to be 1 mm, the terminal pad area is about 700 $\mu$m diameter, and the solder ball after reflow will also be about 700 $\mu$m diameter. The terminal pad acts as a capacitor to the nearest power or ground plane. This capacitance is on the order of 450 to 600 fF. At a signal frequency of 1 GHz, this capacitance represents an impedance of around 400 $\Omega$ to ground; at 3 GHz, it is about 133 $\Omega$ to ground. In both cases, this impedance represents a significant impedance discontinuity and generates a reflection coefficient of around 15 dB.

In order to reduce this reflection coefficient, high speed designers have resorted to the method of removing the portion of the ground/power plane directly adjacent to the I/O pad. This radical action reduces the capacitance of the pad to the ground/power plane; for example, removing the plane area opposite the pad will reduce the capacitance by approximately a factor of two. At the same time, however, this hole weakens the mechanical stability of the substrate; it can initiate warpage and cause eventual delamination of the substrate.

A need has therefore arisen to break this vicious cycle and conceive a concept for reducing the signal reflection without endangering the mechanical stability of the substrate. Preferably, this structure should be based on a fundamental design concept flexible enough to be applied for different semiconductor product families, BGA structures, and a wide spectrum of design and assembly variations. It should not only meet high electrical and thermal performance requirements, but should also achieve improvements towards the goals of enhanced process yields and device reliability. Preferably, these innovations should be accomplished using the installed equipment base so that no investment in new manufacturing machines is needed.

SUMMARY OF THE INVENTION

One embodiment of the invention is a substrate for use in semiconductor devices, having first and second surfaces and a base structure made of insulating material. A plurality of I/O terminal pads is distributed on the first and second surfaces, and these terminal pads are interconnected by conducting traces integral to the base structure. A plurality of selected metal layers is distributed in the structure; the metal layers are substantially, parallel to the surfaces and separated by the insulating material from each other and from the surfaces. At least one metal layer opposite each of the surfaces has openings therein configured so that the metal areas directly opposite each of the terminal pads are electrically isolated from the remainder of the layer. The width of these openings is selected to provide a predetermined capacitance between each of the terminals and the remainder of the metal layer.

Another embodiment of the invention aims at semiconductor devices, which have an integrated circuit chip with contact pads and a substrate with first and second surfaces and a base structure made of insulating material. A plurality of selected metal layers is distributed in the structure; the metal layers are substantially parallel to the surfaces and separated by insulating material from each other and from the surfaces. At least one metal layer opposite each of the surfaces has openings therein configured so that the metal areas directly opposite each of the terminal pads are electrically isolated from the remainder of the layer. The chip contact pads are connected to the plurality of substrate terminal pads on the first surface, respectively. The terminal pads on the second surface operate as external device terminals having predetermined capacitance.

In both of the embodiments described above, the capacitance of the, terminal pads is determined as the series sum of the capacitive contributions from the isolated area and the opening.

Embodiments of the present invention are related to high pin count, high frequency integrated circuit devices intended for high speed and high power. It is a technical advantage that good electrical match of the high speed input pad to the device can be achieved, which practically eliminates the signal reflection, while the mechanical reliability of the package remains high. The original metallization in the package substrate is almost fully preserved, so that the possibility for warpage due to large metallization gaps in substrate metal layers is avoided. One or more embodiments of the invention offer choices relative to the magnitude of the impedance matching structure and the materials and processes chosen; for the connection to the IC chip, both wire bonding and solder reflow are acceptable.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1A:
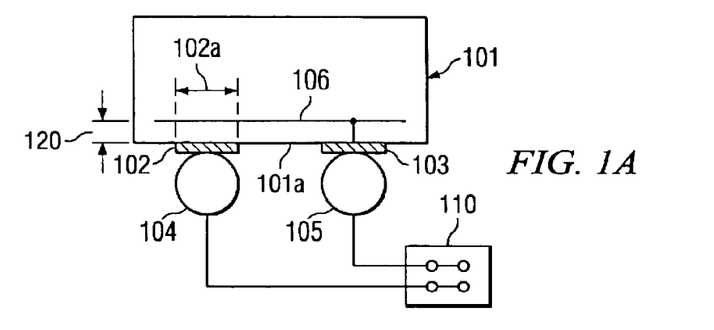
FIG. 1A is a simplified and schematic drawing of the signal input impedance arising at semiconductor package I/O pads.
Figure 1B:
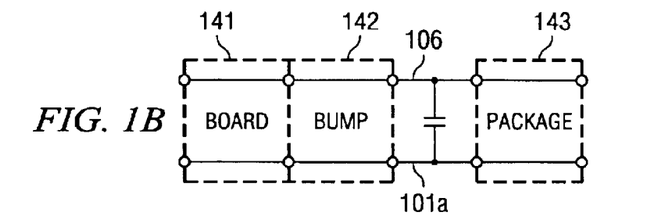
FIG. 1B is a schematic diagram of the signal impedances of the series board, bump, and package, arising for board-assembled semiconductor packages.

FIG. 1A illustrates in simplified and schematic manner the problem, which an input signal to a semiconductor device package 101 encounters. In the example of FIG. 1, the package 101 is of ball grid array (BGA) type; out of a plurality of connections, only one signal I/O terminal 102 and one electric ground terminal 103 are shown; both terminals have reflow connections (such as solder bumps) 104 and 105, respectively, to the external world. As an example, the external world may be a printed circuit board 110. The board, the connection, and the package each have an impedance. In the schematic of FIG. 1B, the impedance ZoBoard of the board is designated 141, the impedance ZoBump of the interconnection is designated 142, the impedance ZoPackage of the package is designated 143.

Due to the fact that the ground plane 106 (for instance a layer of metal) inside the package is separated from the package surface 101a by a layer of insulating material of thickness 120, there is a capacitive coupling between the signal trace and the ground trace. This capacitor is proportional to the square of the diameter 102a of the I/O terminal 102, and inversely proportional to the distance 120 between the I/O terminal and the ground plane. As was mentioned earlier, this capacitance is of the order of 450 to 600 fF for the geometries and signal frequencies of contemporary high speed devices. This capacitance amounts to an impedance on the order of 130 to 400 Ω, dependent on the frequency of the signal. Obviously, an impedance of this magnitude may cause an almost total reflection of the signal.

Figures 2, 4:
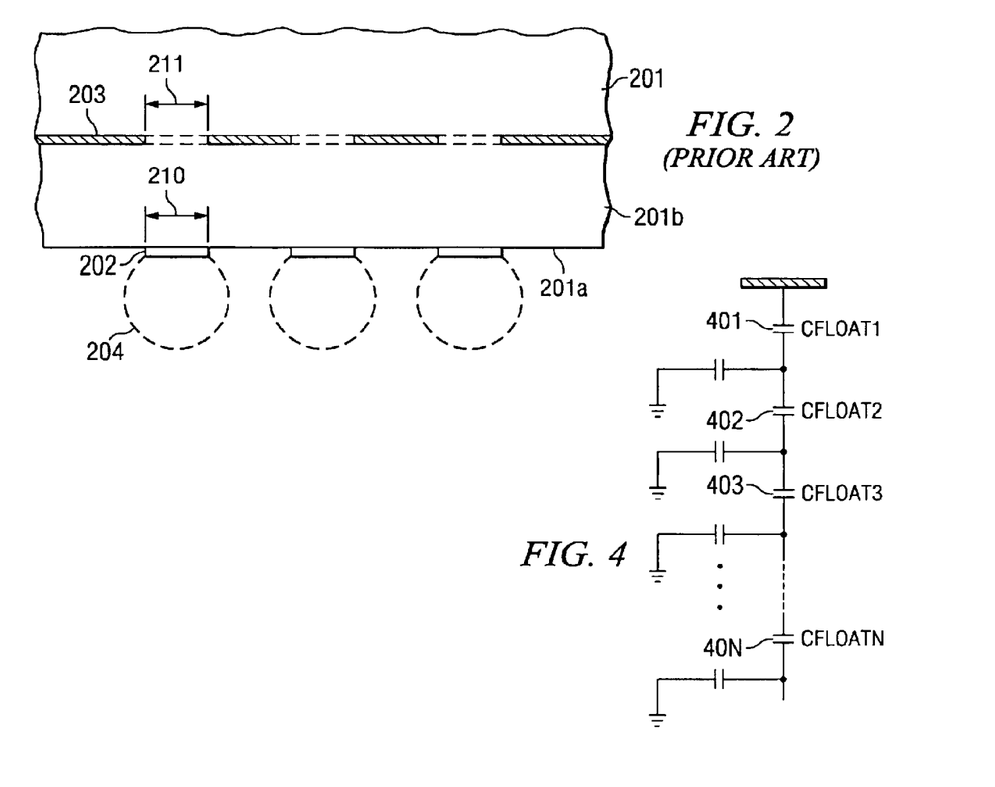
FIG. 2 schematically illustrates the conventional solution to the signal reflection problem at capacitively mismatched signal I/O terminals.
FIG. 4 is a schematic diagram of a series of capacitances to ground for signal impedance matching according to the invention.

FIG. 2 is a schematic cross section of a portion of the substrate of a BGA package 201, depicting the solution of the capacitance problem as practiced in known technology. The I/O pad 202 is on the surface 201a of the package; a "ball" or bump 204 of interconnection material may be attached to pad 202, shown in dashed outline. Pad 202 has a lateral dimension 210, which characterizes the area of pad 202. Separated by some insulating material 201b from surface 201a is a metal layer 203, which may, for example, be at ground potential. In order to avoid the capacitor and impedance problem described above, conventional technology opens a hole in layer 203 of about the same dimensions 211 as the dimension 210 of pad 202.

Additional holes in layer 203 are created for each I/O pad, and analogous holes are created in each metal layer of a multi-layer package substrate. For conventional technology, the end result is a substantial weakening of the mechanical stability of the substrate, leading to warping under thermo-mechanical stress and eventual package delamination.

Figure 3:
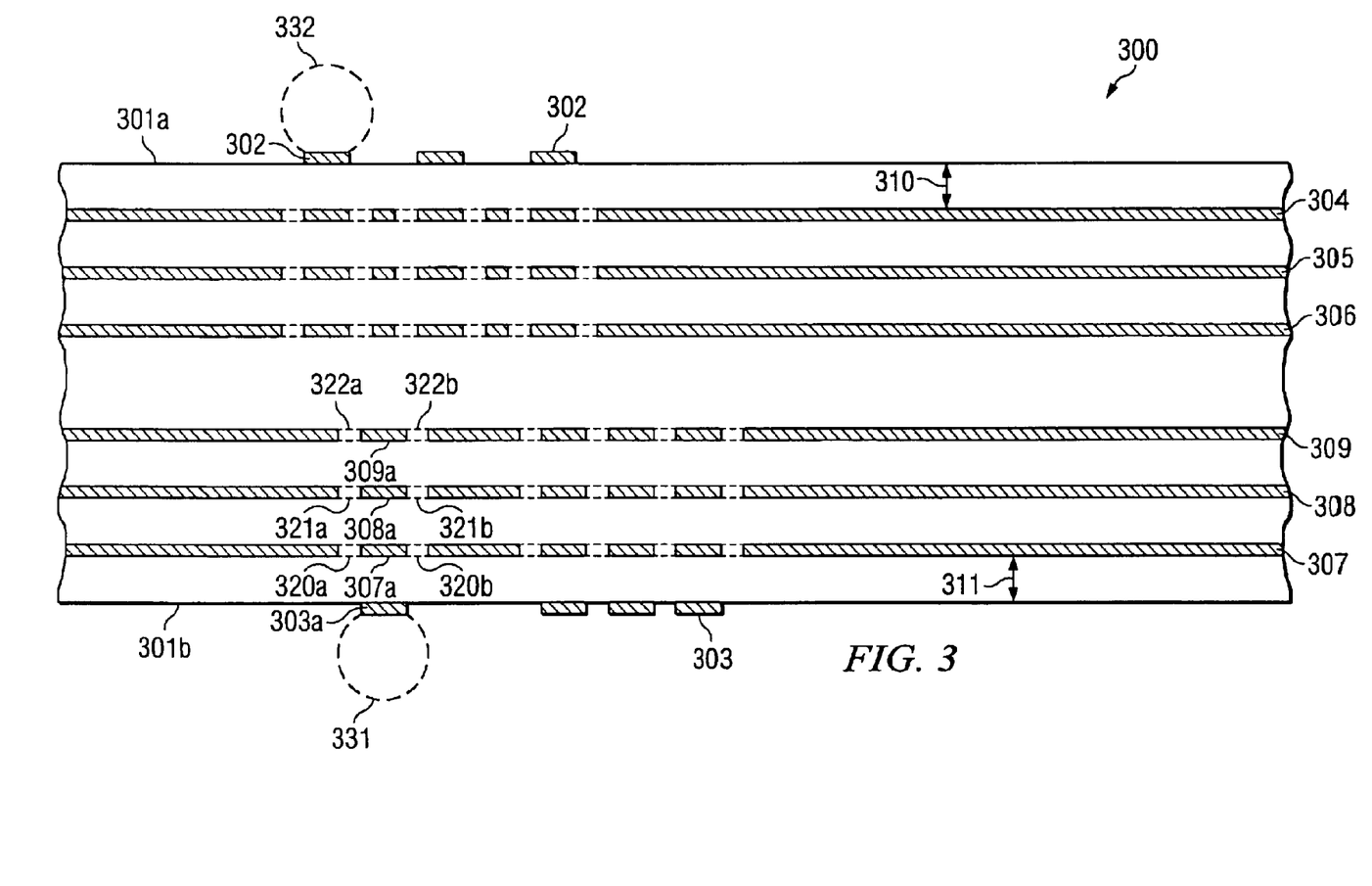
FIG. 3 is a schematic cross section of a portion of a multi-layer substrate for semiconductor packages according to an embodiment of the invention.

The schematic cross section of FIG. 3 illustrates an embodiment of the present invention, a substrate, generally designated 300, for use in semiconductor devices such as BGAs. The substrate 300 has sheet-like form with first surface 301a and second surface 301b. Examples for substrate thicknesses are between 25 and 3000 µm, preferably between 25 and 1000 µm. The base structure of substrate 300 is made of an electrically insulating material; examples are ceramics, plastics, or polymers. On the first surface 301a and on the second surface 301b are pluralities of I/O terminal pads; in FIG. 3 they are designated 302 and 303 respectively. These pads may have square or circular shapes with diameters typically between 500 and 1000 µm. The pads are preferably made of copper or copper alloy, suitable for pressure contacts. Alternatively, the pads may have a thin surface layer suitable for attaching reflow materials, such as tin solders, or for attaching bonding wires, such as gold wires. Preferred pad surface layers are gold, palladium, silver, or nickel. Pads 302 and 303 are interconnected by electrically conducting traces integral to the base structure. The traces are not shown in FIG. 3; base structures with traces are supplied to the industry for instance by NTK of Japan (plastic substrates) and Kyocera of Japan (ceramic substrates).

As FIG. 3 shows, there is a plurality of selected metal layers distributed in the base structure of substrate 300. These layers are substantially parallel to the surface 301a and 301b, and are typically grouped symmetrically to the core, or centerline of substrate 300. In the example of FIG. 3, there are six layers shown; the ones in proximity to surface 301a are designated 304, 305, and 306; the layers closer to surface 301b are designated 307, 308, and 309. Typically, the layers are made of copper or copper alloy and have a thickness in the range from 30 to 50 µm. Between the layers is the insulating material of the substrate base structure (ceramic or plastic); an insulating layer of thickness 310 is also between surface 301a and the nearest metal layer 304, and an insulating layer of thickness 311 between surface 301b and the nearest metal layer 307. Insulator thicknesses 310 and 311 may be between 10 to 200 µm, preferably between 30 and 50 µm.

Metal layer 307 is preferably at electrical ground potential. The capacitance of a specific pad 303a relative to the ground layer is reduced, according to the invention, by the method illustrated in FIG. 3: metal layer 307 has an opening around its portion 307a directly opposite pad 303a. This opening is shaped as an annulus; examples are a ring, a rectangle, or a square. The width of the annulus is preferably in the range from 20 to 200 µm. In the cross section of FIG. 3, the annulus portions 320a and 320b are indicated. Due to this opening, layer portion 307a is electrically isolated from the remainder of layer 307, and is electrically "floating". Portion 307a has preferably a size approximately equal to the size of the terminal pad 303a. In the production process of substrate 300, the floating portion 307a of layer 307 is deposited as additional metallization, for instance by a process such as electroless plating. These processes are applied by, for example, the companies NKT and Kyocera mentioned above.

As a result of the annulus-shaped opening, the capacitance of pad 303a to ground is low due to the series sum of the capacitive contributions. Let the capacitance of pad 303a to floating layer portion 307a be Cfloat; let further the capacitance of the gap to ground be Cgap; and let the total capacitance of pad 303a to ground be Ctot. The total capacitance is calculated from:

$$1/C_{tot}=1/C_{float}+/C_{gap}.$$

Typical experimental values based on preferred technical implementations are approximately:

$$1/C_{tot}=1/500 \text{ fF}+1/50 \text{ fF}=1/45 \text{ fF}.$$

The capacitance of pad 303a to ground is reduced by the annulus-shaped opening to less than 10% of its original value. In general for the pad, the ratio of the capacitance of the floating layer to the capacitance of the opening fringe field will be on the order of 10:1 or higher, dependent on the metal separation generated by the opening. The widths of the openings (320a, 320b; 321a, 321b; etc.) are selected to provide a pre-determined capacitance between the terminal pad 303a and the remainder of metal layer 307.

Further reductions of the capacitance can be achieved by repeating the method of creating annulus-shaped openings in the subsequent metal layers 308 and 309. In FIG. 3, the opening in layer 308 is indicated by 321a and 321b, creating floating layer 308a, and for layer 309 by 322a and 322b, creating floating layer 309a. In general terms, a series string of capacitances is obtained as depicted in FIG. 4, where floating capacitance 401 is created from layer 1, floating capacitance 402 from layer 2, floating capacitance 403 from layer 3, etc., until floating capacitance 40N is created from layer N. The total capacitance is reduced with every addition.

The fact that layer portions 307a, 308a, and 309a exist, contributes to the mechanical stability of the metal layers 307, 308, and 309. Consequently, because of the existence of the metal layer portions for the floating capacitances, there is diminished risk that substrate 300 will warp or delaminate under thermomechanical stress. The reliability of substrate 300 is significantly improved.

The method of reducing the capacitance for terminal pad 303a can be repeated for any other pad of plurality 303 or 302 by creating annulus-shaped openings in one or more of the metal layers 304 to 309. A number of examples are depicted in FIG. 3. In each case, the width of the opening is selected to provide a predetermined capacitance between the selected terminal pad and the remainder of the selected metal layer. The method is particularly useful for layers at ground potential, or layers providing power lines.

In order to enhance the mechanical stability of the floating layer portions, it may be advantageous to apply a stabilizing approach. In such an approach, the floating portion, such as 307a in FIG. 3, is connected to a via and thus mechanically anchored by the via.

As indicated in FIG. 3, I/O pads 302 and 303 can be used for connections to external parts. The connections may be established by pressure contacts, bonding wires, or reflow material such as solder balls. The latter option is indicated in FIG. 3 by the dashed outlines 331 and 332.

Figure 5:
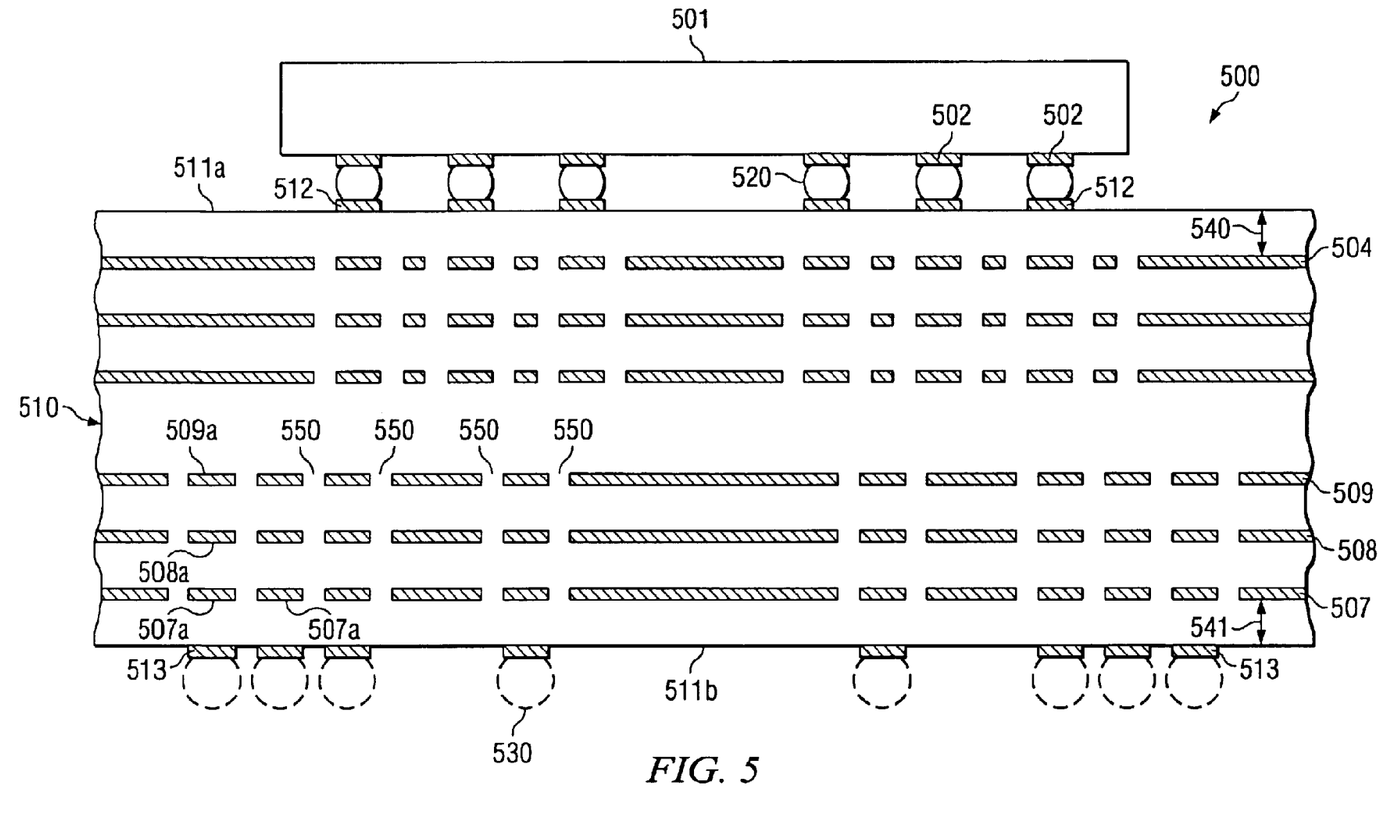
FIG. 5 is a schematic cross section of another embodiment of the invention, illustrating a BGA-type flip-chip device having a substrate with signal impedance-matched terminals.

Another embodiment of the invention is depicted in the schematic cross section of FIG. 5. The figure shows an electronic device, generally designated 500, consisting of an integrated circuit chip 501 with a plurality of contact pads 502, and a substrate 510. The substrate has a sheet-like form with first surface 511a and second surface 511b. Preferred substrate thickness is between 100 and 1000 µm. The base structure of substrate 510 is made of an electrically insulating material such as ceramic of plastic.

On the first surface 511a is a plurality of I/O terminal pads 512, and on the second surface 511b is a plurality of I/O terminal pads 513. In the example of FIG. 5, terminal pads 512 serve as attachment sites for reflow connections to chip 501. The reflow material is indicated by connections 520. For reflow material such as tin or tin alloys, terminal pads 512 are preferably copper pads with a surface of a thin layer of nickel, gold, palladium or alloys thereof. If terminal pads 512 were to serve as attachment sites for bonding wires made of gold or gold alloys, the pads 512 would preferably be copper sites having a surface with a thin layer of silver or palladium. The terminal pads 513 serve to interconnect device 500 to external parts. FIG. 5 indicates interconnection elements 530 made of reflow material such as tin or tin alloys (shown in dashed outlines). Alternatively, however, terminal pads 513 could form interconnections by pressure contact. Pads 512 and 513 are interconnected by electrically conductive traces integral to the base structure of substrate 510; the traces are not shown in FIG. 5.

As FIG. 5 illustrates, there is a plurality of selected metal layers distributed in the base structure of substrate 510. These layers are substantially parallel to the surfaces 511a and 511b, and are typically grouped symmetrically to the core, or centerline of substrate 510. The layer closest to surface 511a is designated 504, the distance 540 between layer 504 and surface 511a is about 30 to 100 µm, in some substrates as little as 10 µm. The layer closest to surface 511b is designated 507, the distance 541 between layer 507 and surface 511a is about 30 to 100 µm, sometimes only 10 µm. Typically, the layers are made of copper or copper alloy and have a thickness in the range from 30 to 50 µm. Between the layers is the insulating material of the substrate base structure (ceramic or plastic).

In the device 500 shown in FIG. 5, the metal layer 507 is at electrical ground potential. The capacitance of all pads 513 relative to the ground layer 507 is reduced, according to the invention, by the method illustrated in FIG. 5: there are openings in metal layer 507 configured so that the metal areas directly opposite each of the terminal pads 513 are isolated from the remainder of metal layer 507 and electrically floating. These floating metal areas have preferably a size about equal to the size of the terminal pads 513. The openings are shaped as an annulus, such as a ring or a rectangle. The width of the annulus is preferably in the range from 20 to 200 µm. In the cross section of FIG. 5, the annulus portions of the plurality of annuli are designated by 550.

As explained above, it is a result of the annulus-shaped openings that the capacitance of each terminal pad to ground is low due to the series sum of the capacitive contributions. Further reductions of the capacitance can be achieved by repeating the method of creating annulus-shaped openings in the subsequent metal layers (in FIG. 5 in layers 508 and 509) relative-to the terminal pads 513 on surface 511b. The series string of floating capacitances of metal portions 507a, 508a, and 509a for each terminal pad 513 follows the method depicted in FIG. 4. On the other hand, the fact that metal areas 507a, 508a, and 509a remain in their respective layers 507, 508 and 509, retains the mechanical strength of substrate 510 and diminishes the risk that substrate 510 will warp or delaminate when device 500 is subjected to temperature cycling in reliability tests.

Figure 6:
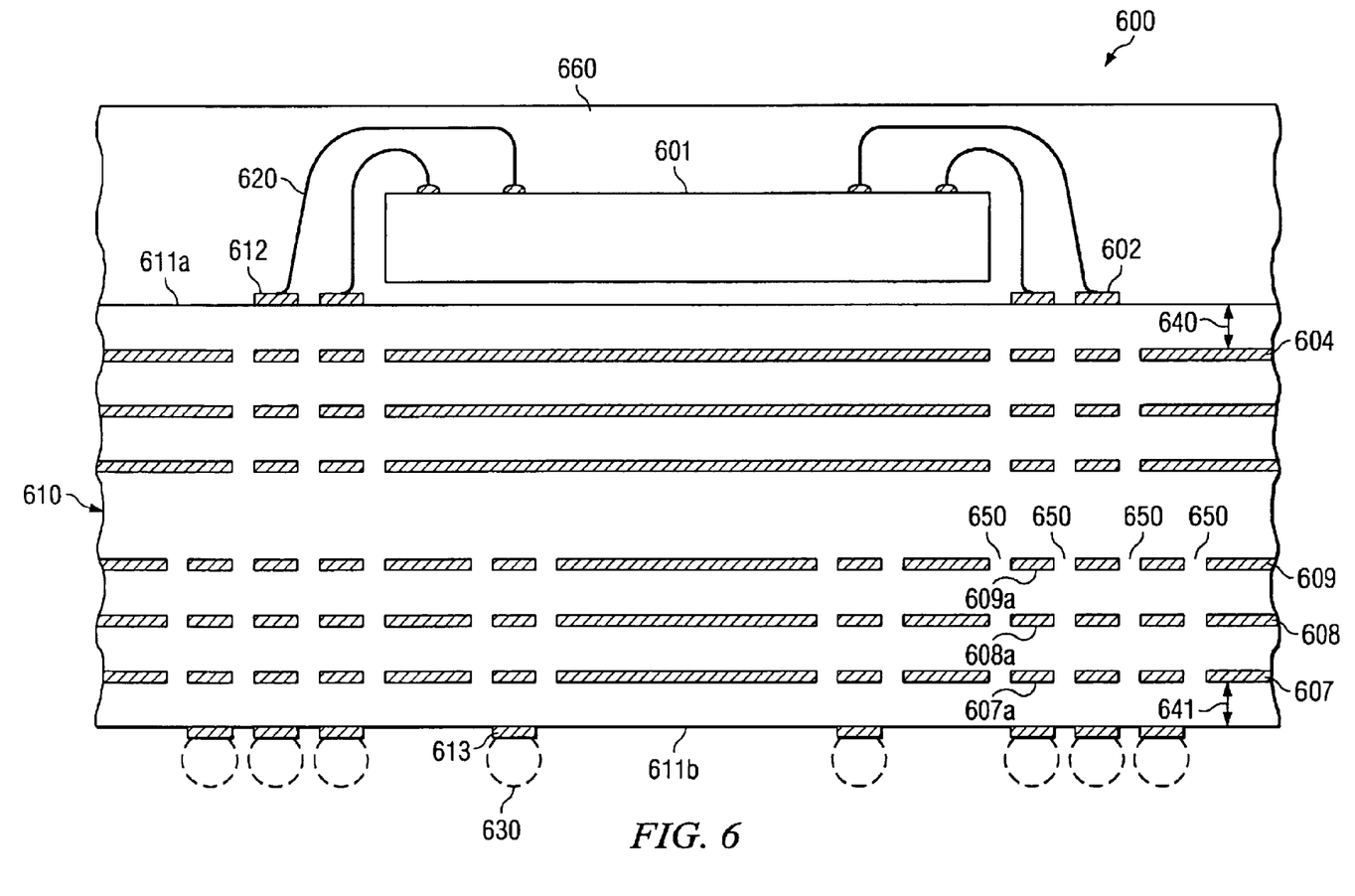
FIG. 6 is a schematic cross section of another embodiment of the invention, illustrating a BGA-type wire-bonded device having a substrate with signal inpedance-matched terminals.

Yet another embodiment of the invention is depicted in the schematic cross section of FIG. 6. It illustrates an electronic device, generally designated 600, comprising an IC chip 601 with a plurality of contact pads 602, and a substrate 610. The substrate has a sheet-like form, is made of an electronically insulating material such as ceramic or plastic, has a preferred thickness between 100 and 1000 $\mu$m, and has a first surface 611a and a second surface 611b. On the first surface 611a is a plurality of I/O terminal pads 612, and on the second surface 611b is a plurality of I/O terminal pads 613. In the example of FIG. 6, terminal pads 612 serve as attachment sites for bonding wire connections to chip 601. The wires, designated 620, are typically gold or gold alloys, and the terminal pads 612 are preferably copper pads with a surface of a thin layer of silver, palladium or alloys thereof. The terminal pads 613 serve for interconnecting device 600 to external parts through reflow material 630 such as tin or tin alloys (shown in dashed outlines). Alternatively, however, terminal pads 613 could form interconnections by pressure contact. Pads 612 and 613 are interconnected by electrically conductive traces integral to the base structure of substrate 610; the traces are not shown in FIG. 6. For the protection of gold wires 620, chip 601, wires 620, and at least a portion of substrate surface 611a are protected by encapsulation material 660, for example molding compound.

Analogous to the embodiment discussed in conjunction with FIG. 5, the substrate of 610 of FIG. 6 comprises a plurality of selected metal layers, which are substantially parallel to the surfaces 611a and 611b, and are typically grouped symmetrically to the core, or centerline of substrate 610. The layer closest to surface 611a is designated 604, the distance 640 between layer 604 and surface 611a is about 30 to 100 $\mu$m, in some substrates as little as 10 $\mu$m. The layer closest to surface 611b is designated 607, the distance 641 between layer 607 and surface 611b is about 30 to 100 $\mu$m, sometimes only 10 $\mu$m. Typically, the layers are made of copper or copper alloy and have a thickness in the range from 30 to 50 $\mu$m. Between the layers is the insulating material of the substrate base structure (ceramic or plastic).

In the device 600 shown in FIG. 6, the metal layer 607 is at electrical ground potential. The capacitance of all pads 613 relative to the ground layer 607 is reduced, according to the invention, by the method illustrated in FIG. 6: there are openings in metal layer 607 configured so that the metal areas directly opposite each of the terminal pads 613 are isolated from the remainder of metal layer 607 and electrically floating. These floating metal areas have preferably a size about equal to the size of the terminal pads 613. The openings are shaped as an annulus; such as a ring or a rectangle. The width of the annulus is preferably in the range from 20 to 200 $\mu$m. In the cross section of FIG. 6, the annulus portions of the plurality of annuli are designated by 650.

As explained above, it is a result of the annulus-shaped openings that the capacitance of each terminal pad to ground is low due to the series sum of the capacitive contributions. Further reductions of the capacitance can be achieved by repeating the method of creating annulus-shaped openings in the subsequent metal layers (in FIG. 6 in layers 608 and 609) relative to the terminal pads 613 on surface 611b. The series string of floating capacitances of metal portions 607a, 608a, and 609a for each terminal pad 613 follows the method depicted in FIG. 4. On the other hand, the fact that metal areas 607a, 608a, and 609a remain in their respective layers 607, 608 and 609, retains the mechanical strength of substrate 610 and diminishes the risk that substrate 610 will warp or delaminate when device 600 is subjected to temperature cycling in reliability tests.

It is a technical advantage for certain embodiments to connect the isolated, or "floating", metal layer areas to vias and thereby to "anchor" these areas mechanically to the vias. In the schematic cross section of FIG. 7, a portion of the substrate depicted in FIG. 3 is shown enlarged to emphasize some detail involved in the "anchoring" of the floating pads. The substrate portion, generally designated 700, comprises insulating material, a surface 701, and a few terminal pads 702a, 702b, etc. The terminal pads are of circular shape. For connection to IS external parts, a connection element 703 such as a solder ball, shown in dashed outlines, may be attached to the terminal pads; one of these connection elements is shown attached to terminal pad 702a.

Figure 7:
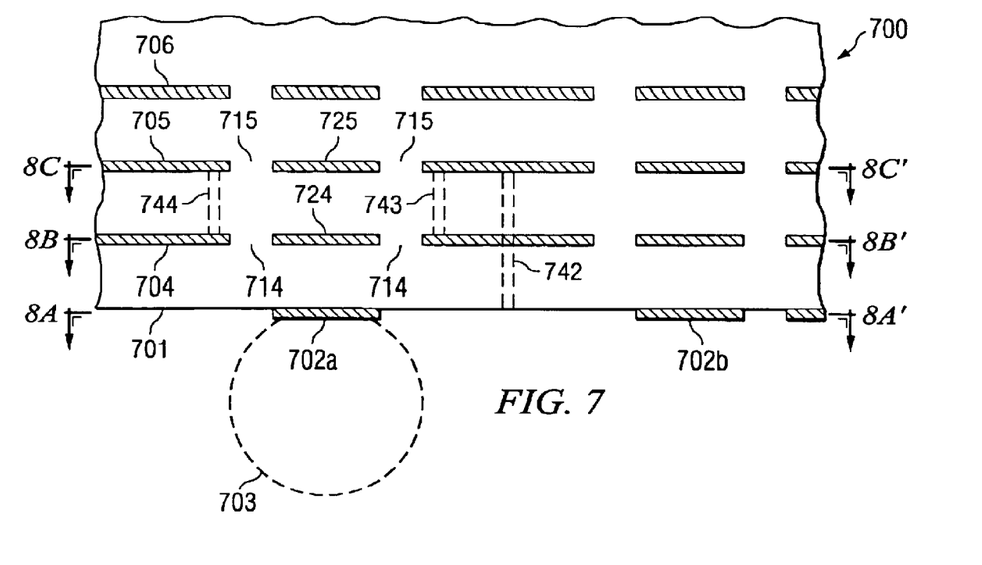
FIG. 7 is a schematic cross section of a portion of a multi-layer substrate for semiconductor packages, showing detail of an embodiment of the invention.

FIG. 7 shows the selected metal layers 704, 705 and 706 distributed in the insulating material of substrate 700. The layers are substantially parallel to surface 701.

Figure 8A:
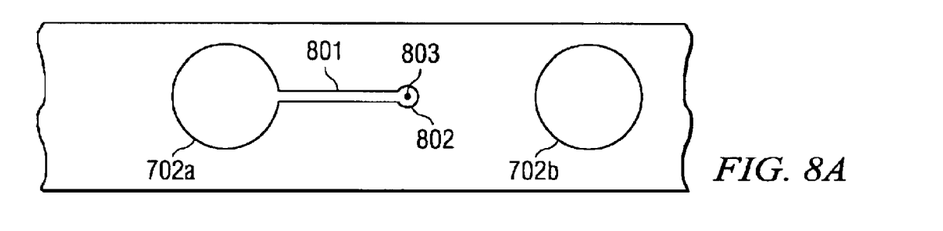
FIGS. 8A, 8B, and 8C are schematic top views of cross sections taken at various planes in a substrate, detailing features of an embodiment of the invention.
Figure 8B:
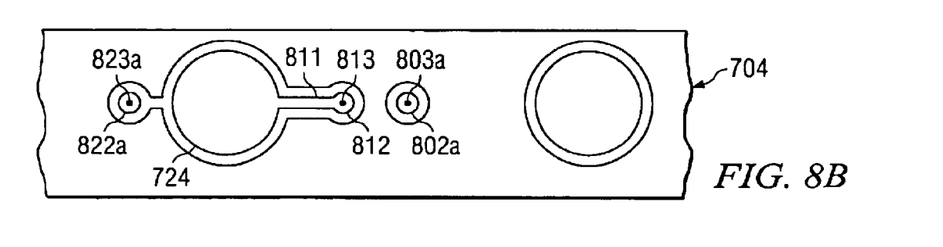
Figure 8C:
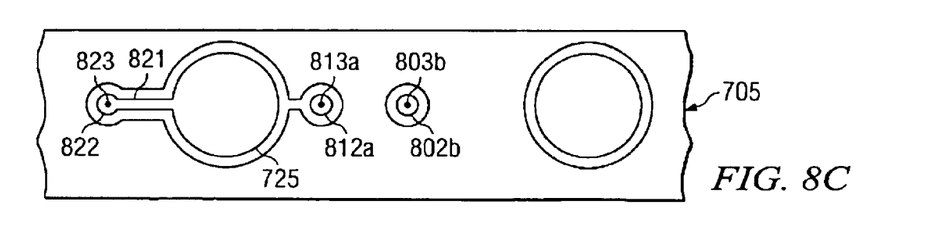

Layers 704 and 705, closest to surface 701, may serve as electrical ground or power planes. Openings 714 and 715 in the layers 704 and 705 create floating pads 724 and 725, respectively. Floating pads 724 and 725 have approximately the same outline and area as terminals pad 702a. In order to illustrate the anchoring of these floating pads 724 and 725 more clearly, cuts along the planes A—A', B—B', C—C' in FIG. 7, administered in the center of the metal layers, are depicted in FIGS. 8A, 8B, and 8C, respectively. Equal numbers refer to identical objects.

In the top view of FIG. 8A, the cut in the A—A' plane shows terminal pad 702a with an attached signal trace 801 in the same metallization plane. Signal trace 801 ends in via pad 802. Via pad 802 surrounds the via 803. The vertical position of via 803 is indicated in FIG. 7 by dashed lines 742. By connecting the terminal pad 702a to via 803, terminal pad 702a is mechanically (and electrically) anchored. In FIG. 8, 702b indicates the top view of an adjacent terminal pad without via connection.

In the top view of FIG. 8B, the cut in the B—B' plane shows the metallization of layer 704 and floating pad 724 with an attached trace 811 in the same metallization plane. Trace 811 ends in via pad 812. Via pad 812 surrounds the via 813. The vertical position of via 813 is indicated in FIG. 7 by dashed lines 743. Further indicated in FIG. 8B are the continuation of the signal pad 802a and the continuation of signal via 803a. 822a is the beginning of the via pad 822 for the floating pad 725 of the next metal layer 705; 803a is the beginning of the via 823 for 20 the floating pad 725 of the next metal layer 705. The vertical position of via 823 is indicated in FIG. 7 by dashed lines 744.

In the top view of FIG. 8C, the cut in the C—C' plane shows the metallization of layer 705 and floating pad 725 with an attached trace 821 in the same metallization plane. Trace 821 ends in via pad 822. Via pad 822 surrounds the via 823. The vertical position of via 823 is indicated in FIG. 7 by dashed lines 744. Further indicated in FIG. 8C are the continuation of the signal pad 802b and the continuation of signal via 803b, as well as the continuation of pad 812a of floating pad 724 and the continuation of via 813a of floating pad 724.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing. It is therefore intended that the appended claims encompass any such modifications or embodiments.

We claim:

1. A substrate for use in semiconductor devices, said substrate having first and second surfaces, comprising:
   a base structure comprising insulating material;
   a plurality of I/O terminal pads distributed on at least one of said first and second surfaces, said terminal pads interconnected by conducting traces;
   a plurality of selected metal layers distributed in said base structure, said metal layers substantially parallel to said surfaces, separated by said insulating material from each other and from said surfaces; and
   at least one metal layer opposite said at least one of said surfaces having annular openings therein configured so that metal areas within said openings directly opposite each of said terminal pads are electrically isolated from the remainder of said layer.

2. The substrate according to claim 1 wherein the width of said openings is selected to provide a pre-determined capacitance between each of said terminal pads and the remainder of said metal layer.

3. The substrate according to claim 1 wherein said layers include power supply layers and layers at ground potential.

4. The substrate according to claim 3 wherein said layers opposite each of said surfaces are at ground potential.

5. The substrate according to claim 1 wherein said metal areas have approximately the same size as said terminal pads.

6. The substrate according to claim 1 wherein said openings have circular or rectangular outlines.

7. The substrate according to claim 1 wherein each of said isolated metal areas is connected to a via and thereby mechanically anchored by said via.

8. The substrate according to claim 1 wherein said selected metal layers in said base structure, from one of said surfaces to the center of said base structure, provide the configuration of an annular opening surrounding an electrically isolated portion of the respective layer, aligned with said respective terminal pad.

9. The substrate according to claim 1 wherein said capacitance is determined as the series sum of the capacitive contributions from said isolated area and said opening.

10. The substrate according to claim 1 wherein said insulating material is a ceramic.

11. The substrate according to claim 1 wherein said insulating material is a polymer.

12. A semiconductor device comprising:
    an integrated circuit chip having contact pads;
    a substrate, having first and second surfaces, said substrate comprising insulating material, said substrate having a plurality of I/O terminal pads distributed on at least one of said first and second surfaces, said terminal pads interconnected by conducting traces;
    a plurality of selected metal layers distributed in said substrate, substantially parallel to said surfaces, separated by said insulating material from each other and from said surfaces;
    at least one metal layer opposite each of said at least one of said surfaces having annular openings therein configured so that metal areas within said openings directly opposite each of said terminal pads are isolated from the remainder of said metal layer; and
    said chip contact pads connected to said plurality of substrate terminal pads on said first surface.

13. The device according to claim 12 wherein said chip pads are connected to said substrate terminal pads by reflow interconnections.

14. The device according to claim 12 wherein said chip pads are connected to said substrate terminal pads by bonding wires.

15. The device according to claim 12 wherein reflow interconnection elements are attached to said I/O terminal pads on said second substrate surface.

16. A method to fabricate a substrate for use in semiconductor devices, comprising the steps of:
    providing a base structure having first and second surfaces, said base structure comprising insulating material;
    forming a plurality of I/O terminals distributed on at least one of said first and second surfaces, said terminal pads interconnected by conducting traces;
    forming a plurality of selected metal layers distributed in said base structure, said metal layers substantially parallel to said surfaces, separated by said insulating material from each other and from said surfaces; and
    forming at least one metal layer opposite said at least one of said surfaces to provide annular openings therein and configure said openings so that metal areas within said openings are directly opposite each of said terminal pads, electrically isolated from the remainder of said layer.

17. The method according to claim 16 wherein the width of said openings is selected to provide a pre-determined capacitance between each of said terminal pads and the remainder of said metal layer.

18. The method according to claim 17 wherein said capacitance is determined as the series sum of the capacitive contributions from said isolated area and said opening.

19. The method according to claim 16 wherein said metal areas have approximately the same size as said terminal pads.

20. The method according to claim 16 wherein said insulating material is a ceramic.

21. The method according to claim 16 wherein said insulating material is a polymer.

* * * * *